(12) United States Patent
Kashem et al.

(10) Patent No.: US 11,989,050 B2
(45) Date of Patent: May 21, 2024

(54) MULTI-CHIPLET CLOCK DELAY COMPENSATION

(71) Applicant: Advanced Micro Devices, Inc., Santa Clara, CA (US)

(72) Inventors: Anwar Kashem, Boxborough, MA (US); Craig Daniel Eaton, Austin, TX (US); Pouya Najafi Ashtiani, Munich (DE); Deepesh John, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/565,382

(22) Filed: Dec. 29, 2021

(65) Prior Publication Data
US 2023/0205252 A1    Jun. 29, 2023

(51) Int. Cl.
*G06F 1/08*     (2006.01)
*H03K 5/22*     (2006.01)
*H03K 5/00*     (2006.01)

(52) U.S. Cl.
CPC .............. *G06F 1/08* (2013.01); *H03K 5/22* (2013.01); *H03K 2005/00286* (2013.01)

(58) Field of Classification Search
CPC ... G06F 1/08; H03K 5/22; H03K 2005/00286
USPC ........................................................ 327/76
See application file for complete search history.

(56) References Cited

U.S. PATENT DOCUMENTS

| | | | | |
|---|---|---|---|---|
| 5,122,679 A | * | 6/1992 | Ishii | H03K 5/133 327/295 |
| 5,990,719 A | * | 11/1999 | Dai | H03L 7/07 327/236 |
| 6,323,714 B1 | * | 11/2001 | Naffziger | G06F 1/10 327/295 |
| 6,538,957 B2 | * | 3/2003 | Magoshi | H03L 7/0816 365/194 |

(Continued)

FOREIGN PATENT DOCUMENTS

WO       2021-247083 A1    12/2021

OTHER PUBLICATIONS

Geannopoulos, G. & Dai, X., "An Adaptive Digital Deskewing Circuit for Clock Distribution Networks", 1998 IEEE International Solid-State Circuits Conference, Digest of Technical Papers, ISSCC, Paper 25.3, 2 pgs., 1998.

(Continued)

*Primary Examiner* — Ryan Jager
(74) *Attorney, Agent, or Firm* — Volpe Koenig (57) ABSTRACT

Methods and systems are disclosed for clock delay compensation in a multiple chiplet system. Techniques disclosed include distributing, by a clock generator, a clock signal across distribution trees of respective chiplets; measuring phases, by phase detectors, where each phase measurement is associated with a chiplet of the chiplets and is indicative of a propagation speed of the clock signal through the distribution tree of the chiplet. Then, for each chiplet, techniques are further disclosed that determine, by a microcontroller, based on the phase measurements associated with (Continued)

the chiplet, a delay offset, and that delay, based on the delay offset, the propagation of the clock signal through the distribution tree of the chiplet using a delay unit associated with the chiplet.

20 Claims, 6 Drawing Sheets

(56) References Cited

U.S. PATENT DOCUMENTS

| | | | | |
|---|---|---|---|---|
| 6,861,884 | B1 * | 3/2005 | Nguyen | G06F 1/12 |
| | | | | 327/295 |
| 6,943,610 | B2 * | 9/2005 | Saint-Laurent | H03K 5/1506 |
| | | | | 327/295 |
| 7,317,342 | B2 * | 1/2008 | Saint-Laurent | H03L 7/0995 |
| | | | | 327/295 |
| 7,863,960 | B2 * | 1/2011 | Wang | H03L 7/099 |
| | | | | 327/295 |
| 8,205,182 | B1 * | 6/2012 | Zlatanovici | G06F 30/398 |
| | | | | 716/113 |
| 9,231,603 | B2 * | 1/2016 | Liu | H03L 7/0814 |
| 9,582,028 | B1 * | 2/2017 | Xiu | G06F 1/10 |
| 9,898,035 | B2 * | 2/2018 | Yoshiki | G06F 1/10 |
| 10,348,279 | B2 * | 7/2019 | Arp | H03K 5/14 |
| 10,564,664 | B2 * | 2/2020 | Arp | H03K 19/00323 |
| 11,256,284 | B2 * | 2/2022 | Arp | G06F 1/10 |
| 2002/0060595 | A1 * | 5/2002 | Nakano | G06F 1/10 |
| | | | | 327/295 |
| 2019/0140647 | A1 | 5/2019 | Lim et al. | |
| 2020/0105718 | A1 | 4/2020 | Collins et al. | |
| 2020/0356504 | A1 | 11/2020 | Farjadrad | |
| 2021/0152269 | A1 | 5/2021 | Loinaz | |

OTHER PUBLICATIONS

Joo, D. & Kim, T., "Managing Clock Skews in Clock Trees with Local Clock Skew Requirements Using Adjustable Delay Buffers", 2015 International SoC Design Conference, IEEE, 2 pgs., 2015.

Kuttappa, R., et al., "Robust Low Power Clock Synchronization for Multi-Die Systems", 2019 IEEE/ACM International Symposium on Low Power Electronics and Design, IEEE, 6 pgs., 2019.

* cited by examiner

MULTI-CHIPLET CLOCK DELAY COMPENSATION

BACKGROUND

The propagation of data across cascading logic units is typically controlled by clock signals. When interfacing logic units are integrated into two chips, data have to be exchanged over wires across the chips. Due to physical limitations in the density of connecting wires (e.g., 100 wires per millimeter), a physical layer interface is used to drive the data between the logic units. A physical layer is typically designed to operate in a higher data-rate than the native data-rate of the logic units it connects in order to allow for more data to be transferred via the limited number of connections. However, using physical layers introduces an overhead due to their complex circuitry and increased power consumption.

New packaging technologies allow for an increased number of connections between logic units within and across chips (e.g., 10K wires per millimeter) and, thus, more logic units can be packed into one chip and more chips can be assembled in a chip package. In turn, the increased density in logic circuitry and their connections, calls for a simpler mechanism for connecting logic units. A straightforward solution is to directly connect between the output and the input of logic units. However, such a direct connection, although it saves the overhead involved in the use of physical layers, requires a synchronized clock distribution. That is, clock signals that propagate across cascading logic units should be synchronized to enable proper operation.

BRIEF DESCRIPTION OF THE DRAWINGS

A more detailed understanding may be had from the following description, given by way of example in conjunction with the accompanying drawings wherein.

DETAILED DESCRIPTION

Systems and methods are provided for clock delay compensation in a multi-chip system. Clock signals, propagating through clock distribution trees of the system's chiplets, are used to control synchronized operation of cascading logic units. Variations in hardware manufacturing and in environmental conditions create variations in the propagation speeds of clock signals in different chiplets and in different parts of the distribution tree in each chiplet. Consequently, clock signals, when reaching clock-inputs of circuitry that rely on them, are not aligned (that is, they are delayed relative to each other). Techniques described herein monitor phase measurements associated with these misalignments, and based on these phase measurements, periodically adjust delays applied to clock signals to compensate for the misalignments.

Aspects disclosed in the present disclosure describe methods for clock delay compensation in a multiple chiplet system. The methods comprise distributing, by a clock generator, a clock signal across distribution trees of respective chiplets and measuring, by phase detectors, phases, where each phase measurement is associated with a chiplet and is indicative of a propagation speed of the clock signal through the distribution tree of the chiplet. Then, for each chiplet, the methods comprise determining, by a microcontroller, based on the phase measurements associated with the chiplet, a delay offset, and delaying, based on the delay offset, the propagation of the clock signal through the distribution tree of the chiplet using a delay unit associated with the chiplet.

Aspects disclosed in the present disclosure also describe multiple chiplet systems for clock delay compensation. The systems comprise at least one processor and memory storing instructions. The instructions, when executed by the at least one processor, cause the systems to distribute, by a clock generator, a clock signal across distribution trees of respective chiplets and measure, by phase detectors, phases, where each phase measurement is associated with a chiplet and is indicative of a propagation speed of the clock signal through the distribution tree of the chiplet. Then, for each chiplet, the instructions further cause the systems to determine, by a microcontroller, based on the phase measurements associated with the chiplet, a delay offset, and to delay, based on the delay offset, the propagation of the clock signal through the distribution tree of the chiplet using a delay unit associated with the chiplet.

Further, aspects disclosed in the present disclosure describe a non-transitory computer-readable medium comprising instructions executable by at least one processor to perform methods for clock delay compensation in a multiple chiplet system. The methods comprise distributing, by a clock generator, a clock signal across distribution trees of respective chiplets and measuring, by phase detectors, phases, where each phase measurement is associated with a chiplet and is indicative of a propagation speed of the clock signal through the distribution tree of the chiplet. Then, for each chiplet, the methods comprise determining, by a microcontroller, based on the phase measurements associated with the chiplet, a delay offset, and delaying, based on the delay offset, the propagation of the clock signal through the distribution tree of the chiplet using a delay unit associated with the chiplet.

Figure 1:
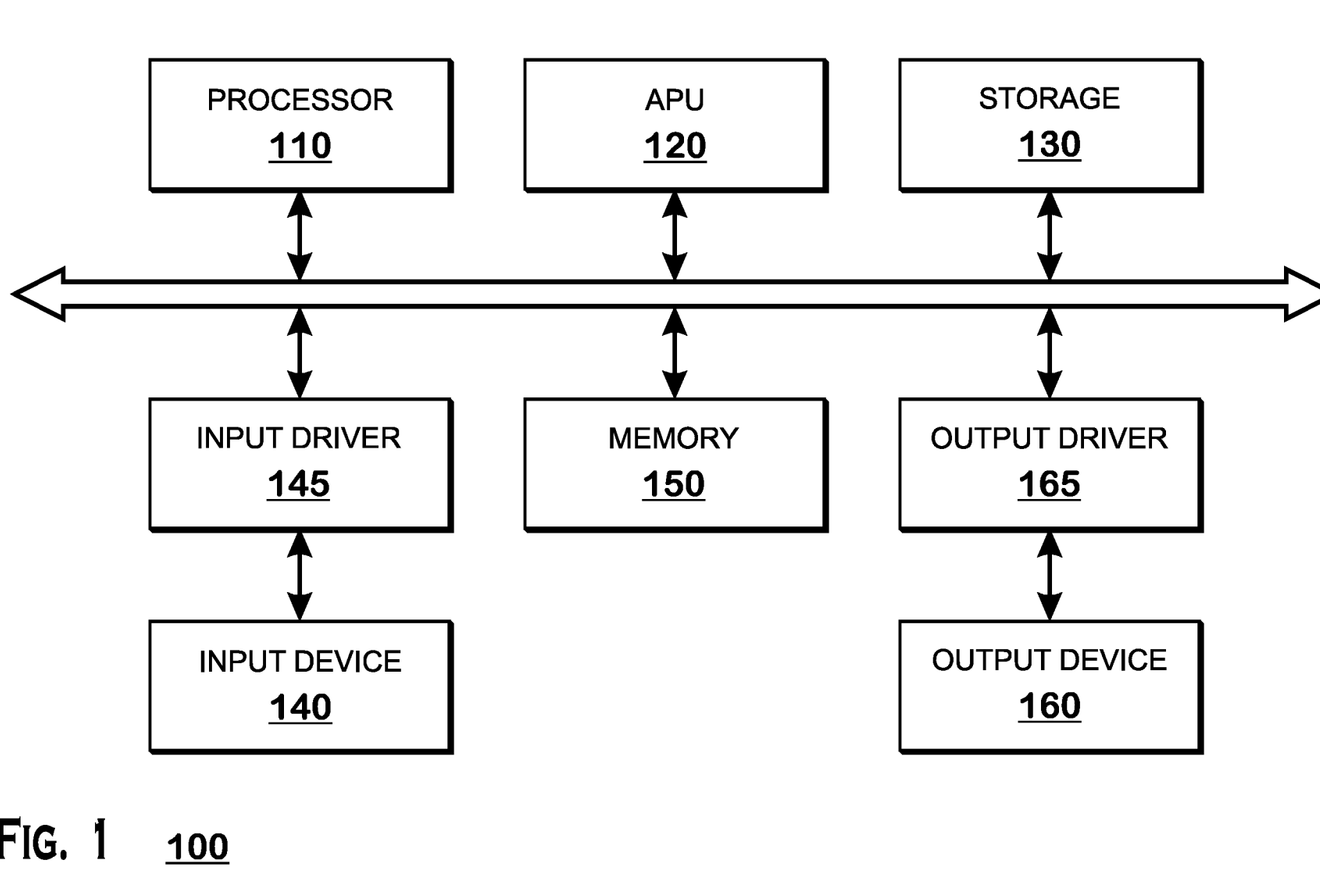
FIG. 1 is a block diagram of an example device, based on which one or more features of the disclosure can be implemented.

FIG. 1 is a block diagram of an example device 100, based on which one or more features of the disclosure can be implemented. The device 100 can be, for example, a computer, a gaming device, a handheld device, a set-top box, a television, a mobile phone, or a tablet computer. The device 100 can include a processor 110, an accelerated processing unit (APU) 120, storage 130, an input device 140, memory 150, and an output device 160. The device 100 can also include an input driver 145 and an output driver 165. The processor 110 and the APU 120 can represent one or more cores of central processing units (CPUs) and one or more cores of APUs, respectively. The memory 150 can represent volatile or non-volatile memory, including random-access memory (RAM), SRAM, dynamic random-access (DRAM), a cache, or a combination thereof. The processor 110, the APU 120, and the memory 150, or a subset thereof, may be located on the same die or on separate dies. In an aspect, the device 100 can include additional components not shown in FIG. 1.

The APU 120 can represent a graphics processing unit (GPU), that is, a shader system comprising one or more parallel processing units that are configured to perform computations, for example, in accordance with a single instruction multiple data (SIMD) paradigm. The APU 120 can be configured to accept compute commands and graphics rendering commands from the processor 110, to process those compute and graphics rendering commands, and/or to provide output to a display (the output device 160).

The storage 130 can include fixed or removable storage, for example, a hard disk drive, a solid-state drive, an optical disk, or a flash drive. The input device 140 can represent, for example, a keyboard, a keypad, a touch screen, a touch pad, a detector, a microphone, an accelerometer, a gyroscope, a biometric scanner, or a network connection (e.g., a wireless local area network card for receipt of wireless IEEE 802 signals). The output device 160 can represent, for example, a display, a speaker, a printer, a haptic feedback device, one or more lights, an antenna, or a network connection (e.g., a wireless local area network card for transmission of wireless IEEE 802 signals). In an aspect, the input driver 145 communicates with the processor 110 (or the APU 120) and the input device 140, and facilitates the receiving of input from the input device 140 to the processor 110 (or the APU 120). In another aspect, the output driver 165 communicates with the processor 110 (or the APU 120) and the output device 160, and facilitates the sending of output from the processor 110 (or the APU 120) to the output device 160.

Figure 2:
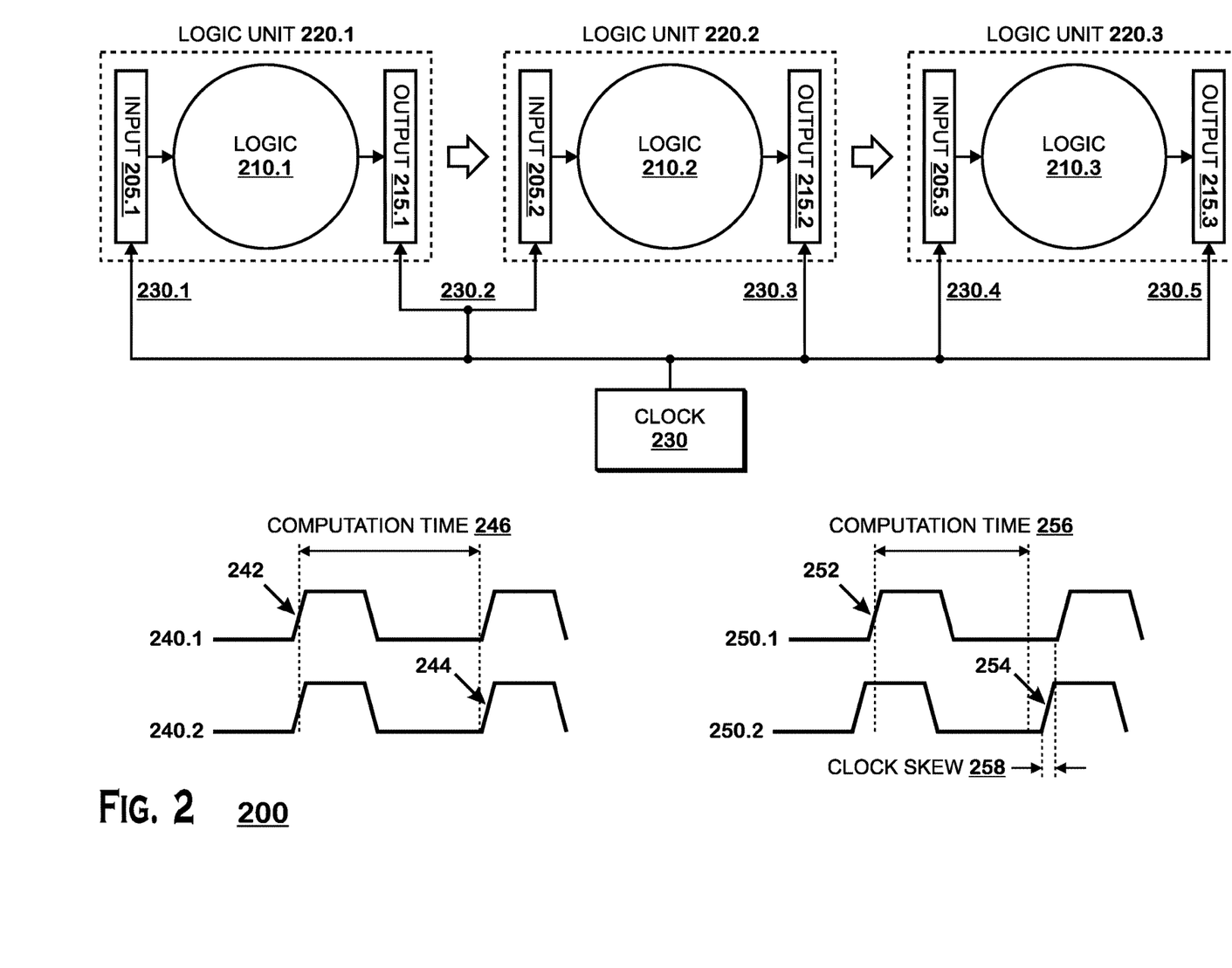
FIG. 2 is a diagram of an example clock distribution to logic units, based on which one or more features of the disclosure can be implemented.

FIG. 2 is a diagram of an example clock distribution to logic units 200, based on which one or more features of the disclosure can be implemented. Current integrated circuit technologies enable the integration of cascading logic units, so that each logic unit performs computational operations on data provided to it from a previous logic unit, and then feeding the next logic unit with its processed data. For example, three logic units 220.1-3 can be designed to implement pipelined computations, as illustrated in FIG. 2. An input (or launching) register 205.1 can hold the input data to be operated on by the first logic unit's circuitry 210.1, the result of which is stored in an output (or capturing) register 215.1. The captured data may be transferred from that output register 215.1 to an input register 205.2 of the second logic unit 220.2 in the pipeline. Upon completion of its computations, the second logic unit's circuitry 210.2 outputs the resulting data into its output register 215.2, to be transferred to the input register 205.3 of the third logic unit 220.3. Likewise, upon completion of its computations, the third logic unit's circuitry 210.3 outputs the resulting data into its output register 215.3, to be transferred down the pipeline to the input register of a subsequent logic unit.

To carry out pipelined processing, as described above, each logic unit should be informed when it can begin launching its operation, that is, when input data are ready in its input register for the logic circuitry to operate on. To that end, a clock signal, generated by a clock generator 230, can be distributed to the registers 205.1-3, 215.1-3. To secure proper operation of the cascading logic units, the distributed clock signal, as measured at the clock inputs of the circuitry that require it (referred to herein as sink points), have to be aligned, as illustrated by clock signals 240.1 and 240.2. For example, logic unit 220.1 can be configured to start its operation based on data stored in input register 205.1 at the rise of the clock pulse 242 measured at sink point 230.1 and to store the resulting data in its output register 215.1. Then, the data stored in output register 215.1 can be released (transferred) into input register 205.2 of logic unit 220.2 at the rise of the clock pulse 244 measured at sink point 230.2. As long as the arrival times of the clock signal to sink point 230.1 and to sink point 230.2 are sufficiently the same, the logic 210.1, once it receives the input data, will be able to complete its computation and store the resulting data in its output register 215.1 prior to the rise of the clock pulse 244 at sink point 230.2 (a pulse rise 244 that triggers a transfer of data between output register 215.1 and input register 205.2). Therefore, when clock signals (measured at sink points) are synchronized, the processed data will properly propagate through the pipeline if each logic unit will complete its operation within a computation time 246 that is within the clock cycle. In another example, where two logic units, e.g., 220.2 and 220.3, are integrated into different chips, the transfer of data from output register 215.2 to input register 205.3 can be triggered by a rise of a clock pulse at sink point 230.3 and a rise of a clock pulse at sink point 230.4, respectively. In such a case too, the clock signals, measured at sink points 230.3 and 230.4, should be synchronized to allow the processed data to properly propagate across the chips.

However, in practice, clock signals, generated by the clock generator 230 and distributed along a clock network (or a clock distribution tree) do not reach circuitry that consume them (sink points) at the same time. For example, a clock signal that is distributed along a path starting from the clock generator 230 and ending at sink point 230.1 may be delayed in time relative to a clock signal that is distributed along a path starting from the clock generator 230 and ending at sink point 230.2, as illustrated by clock signals 250.1 and 250.2. This time delay, namely clock skew 258, includes a static component and a dynamic component. The static component can be caused by the difference in length between two paths, traced from the clock generator 230 to their respective sink points' locations. The dynamic component can be caused by manufacturing variations that cause hardware through which the clock signals travel to change their electrical properties (e.g., conductivity) differently with variations in temperature and voltage. Thus, when designing cascading logic units, e.g., 220.1-3, the clock skew 258 should be taken under consideration, accommodating both the computation time 256 and an expected maximum clock skew 258 within the clock cycle. In other words, logic units 220.1-3 should be designed to complete their operation and load their output registers 215.1-3 before the next rise of the clock pulse 254; such clock pulse rise 254 may occur earlier compared with the clock pulse rise 244 in a case where the clock signals are synchronized. Hence, clock signals as they reach sink points (e.g., 230.1-5) in a chip should be sufficiently aligned (synchronized) so that resulting clock skews will be within a tolerance value, below the expected maximum clock skew 258.

Figure 3:
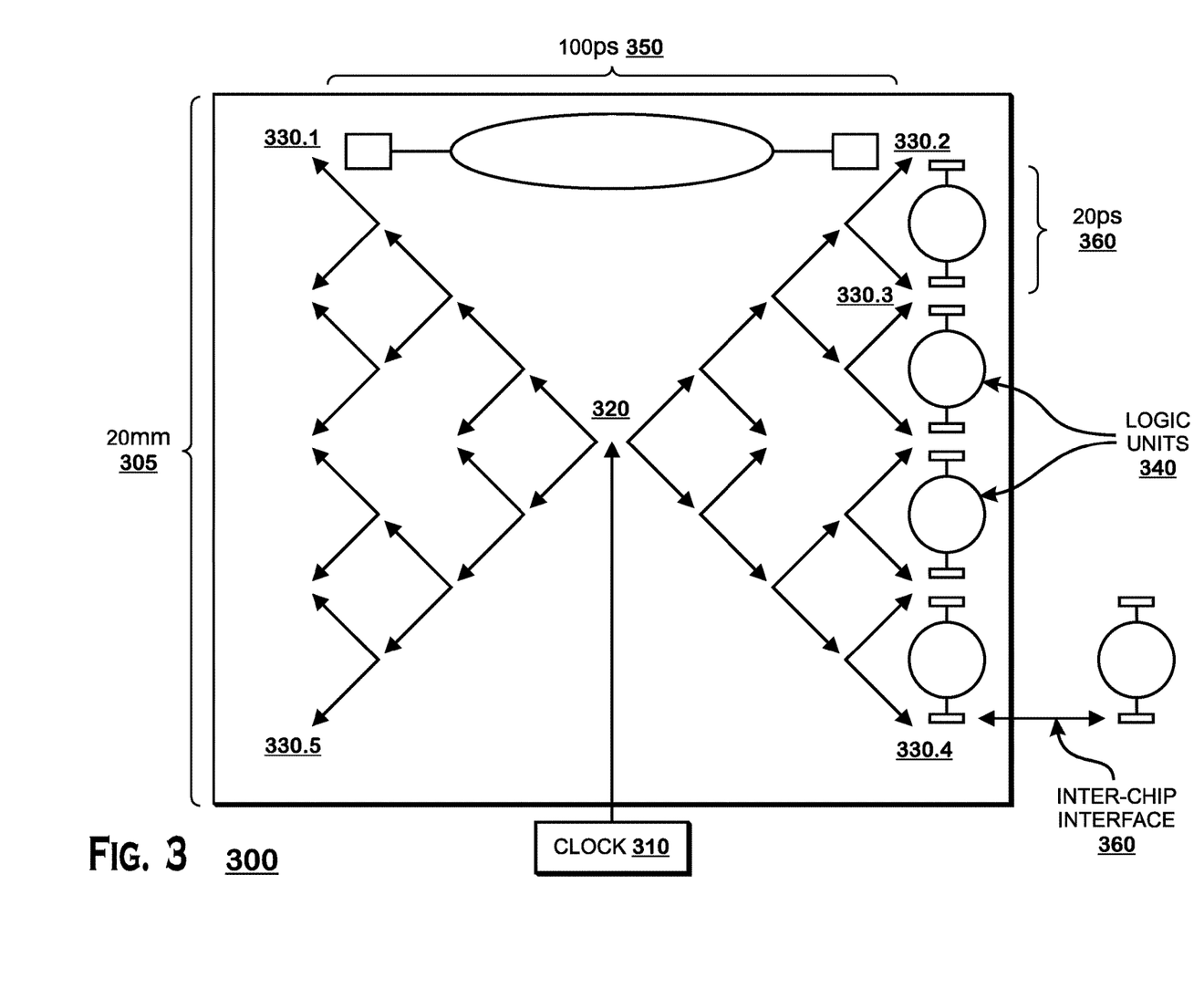
FIG. 3 is a diagram of an example clock distribution tree across a chip, based on which one or more features of the disclosure can be implemented.

FIG. 3 is a diagram of an example clock distribution tree across a chip 300, based on which one or more features of the disclosure can be implemented. FIG. 3 shows a chip (e.g., of 20 square millimeter 305), including logic units 340 that interface through their registers (e.g., the logic units 220.1-3, illustrated in FIG. 2). The chip also includes a clock distribution tree 320, that is fed at its root with a clock signal, generated by a clock generator 310. The generated clock signal splits into clock signals that propagate across the tree's branches, reaching circuitry that are designed to be triggered by the arrival of the clock signals at their respective inputs (sink points). As explained above, the arrival times of the clock signals at the various sink points vary. The extent of variation in arrival times at two sink points depends on the variation (in physical and electrical properties) in the paths through which the clock signals propagate to reach the two sink points. For example, the difference in arrival times at sink point 330.1 and sink point 330.2 can be 100 picosecond 350. However, the difference in arrival times at sink point 330.2 and sink point 330.3 can be only 20 picoseconds because of the proximity of these sink points to each other. Thus, a design in which computations are broken into computational components that are executed locally within respective cascading logic units, can reduce the clock skew each logic unit has to tolerate.

As explained above, during design, out of a clock period, some time has to be allocated for the computation 256 and some time has to be reserved for the expected maximum clock skew 258. Thus, the clock delay associated with a logic unit should be maintained below the relied upon maximum clock skew. To secure proper performance of cascading logic units 340, the clock delays (or clock skews) caused by the different arrival times of the clock signals at respective sink points, associated with interfaces between the logic units throughout the chip, have to be controlled. Furthermore, when a logic unit interfaces with another logic unit that is integrated into another chip 360, clock signals arriving at sink points, associated with interfaces between the logic units, have to be aligned (synchronized). That is, the time delays associated with inter-chip interface 360 also have to be controlled, as further described in reference to FIG. 4.

Figure 4:
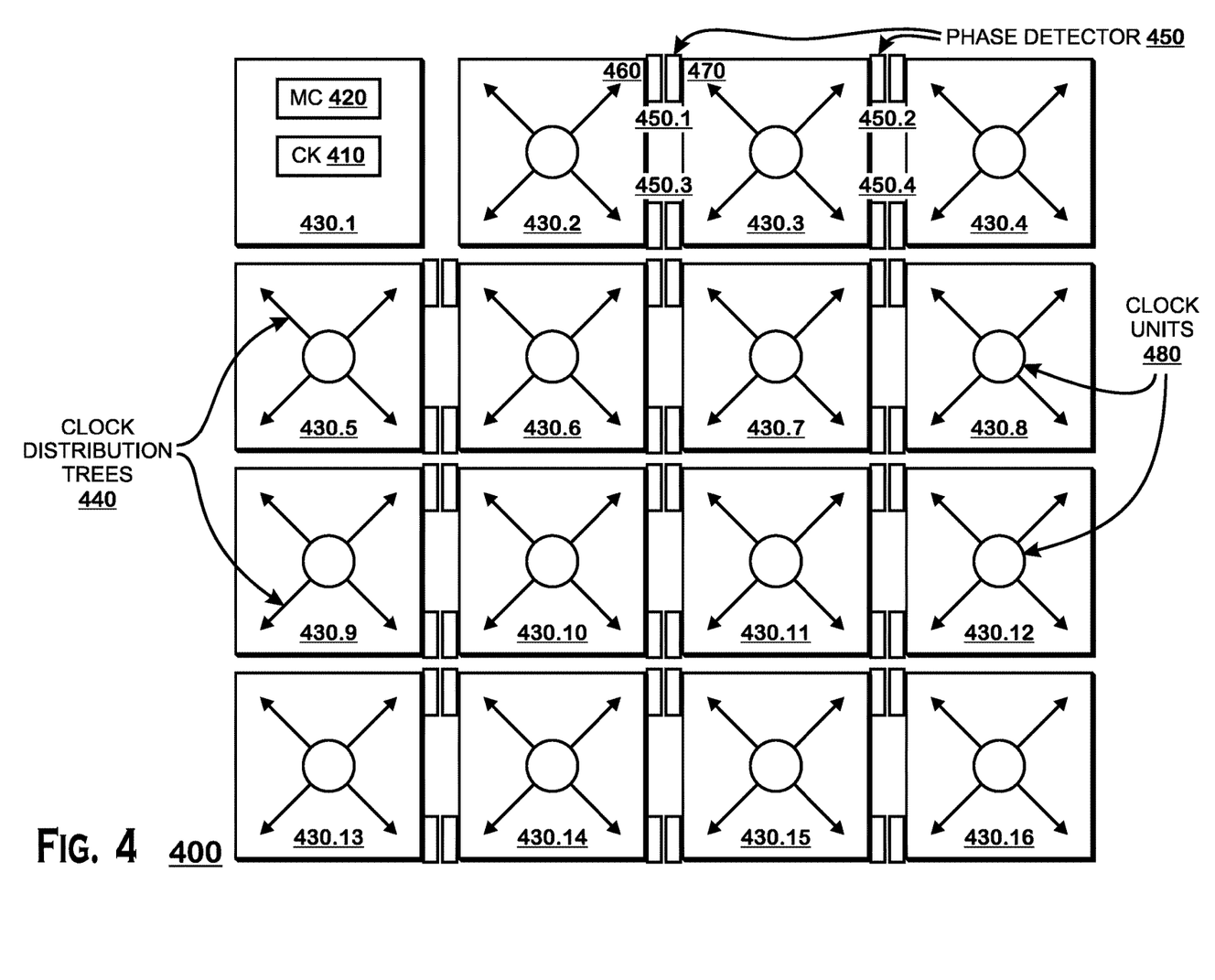
FIG. 4 is a diagram of an example multi-chiplet system, based on which one or more features of the disclosure can be implemented.

FIG. 4 is a diagram of an example multi-chiplet system 400, based on which one or more features of the disclosure can be implemented. The system 400 include multiple chiplets 430.1-16 packaged in a four by four array. A clock generator 410 and a micro-controller 420 are integrated into the first chiplet 430.1, and logic circuitry (e.g., the logic units 220.1-3, 340 discussed in reference to FIGS. 2-3) are integrated into the other chiplets 430.2-430.16. The clock signal from the clock generator 410 is distributed to clock units 480, positioned at the center of each chiplet, via wires that may be integrated into a carrier that holds the chiplets (e.g., a packaging such as an interposer, a layer of silicon, or an organic substrate). A clock unit includes a clock receiver that receives the clock signal and a delay unit that can introduce a programmable delay offset to the received clock signal (as further described in reference to FIG. 5). Each clock unit 480 further distribute the received (and potentially delayed) clock signal through its chiplet's clock distribution tree 440 that propagates the clock signal to various sink points—e.g., points of interface 460, 470 between logic units.

Chiplets are relatively small (e.g., 5 square millimeter), and, therefore, the difference in the arrival times of clock signals at two sink points within a chiplet (i.e., the clock skew) can be within 20 picoseconds. However, when logic units interface across chiplets, the difference in arrival times at two neighboring sink points of clock signals from different chiplets may be larger. As shown in FIG. 4, pairs of phase detectors 450 are placed at locations of interface between pairs of chiplets. The phase detectors 450 are configured to measure the phase (delay) between two clock signals, as further described in reference to FIG. 5. For example, one logic unit that is integrated into a region within a chiplet 430.2 may be interfacing with another logic unit that is integrated into a neighboring region within another chiplet 430.3. Since, the output of the one logic unit is the input of the other logic unit, the latter should be signaled when the former concluded its operation. To that end, as explained above, the clock signals, as measured at the logic units' respective sink points 460, 470, should be aligned (synchronized). Such alignment can be done based on the phase between these clock signals that, as disclosed herein, can be measured by a pair of phase detectors 450.1. Thus, each phase detector 450 in the system 400 provides a phase measurement, indicative of a current clock skew existing between clock signals arriving at two sink points across neighboring chiplets. Aspects, disclosed herein, utilize such phase measurement to reduce the clock skew by adjusting the delay between the clock signals that are distributed to the two sink points.

The microcontroller 420 is configured to dynamically adjust the delays of the clock signals that are distributed throughout each of the chiplets 430.2-16. The microcontroller 420 is communicatively linked to the phase detectors 450 and to programmable delay units in the clock units 480 (e.g., delay units 542, 552, shown in FIG. 5). Due to manufacturing variations different chiplets may respond differently to changes in temperature and/or voltage levels. Additionally, due to variation in the paths through which clock signals travel to respective sink points, the clock signals have different arrival times. The difference in arrival times with respect to two sink points in close proximity within a chiplet may be tolerable (e.g., below 20 picoseconds). However, the difference in arrival times with respect to two sink points that are located on two different chiplets may be large. Therefore, clock skews, caused by differences in signal propagation speeds in different distribution paths across the chiplets and within each chiplet, should be reduced by introducing delays at different points on these distribution paths, as disclosed herein.

The microcontroller 420 is configured to monitor phase measurements received from the phase detectors 450. The phase detectors 450 may be integrated into the carrier that holds the chiplets (or may be integrated onto the interface edges of the chiplets themselves), where each pair of phase detectors (e.g., 450.1) is positioned at interface locations between chiplets (e.g., by sink points 460, 470 where two logic units from chiplet 430.2 and chiplet 430.3 are interfacing). If phase measurements, received from any of the phase detectors associated with a pair of chiplets, is above a tolerance value (a maximum clock skew), the microcontroller 420 can instruct the clock unit 480 of the chiplet with the faster clock signal (out of the pair) to adjust its programmable delay so that the skew is decreased. For example, if based on phase measurements received from a pair of phase detectors 450.1 associated with two interfacing logic units—e.g., one logic unit at sink point 460 of chiplet 430.2 and another logic unit at sink point 470 of chiplet 430.3—it is determined that the clock signal that reached sink point 460 is ahead of the clock signal that reached sink point 470, the microcontroller 420 can instruct the clock unit of chiplet 430.2 to introduce a delay into the clock signal that is distributed throughout chiplet 430.2 (or to introduce a delay into the clock signal that is distributed toward sink point 460), so that the skew between the pair of chiplets (as measured by the phase detectors 450.1) is reduced.

Figure 5:
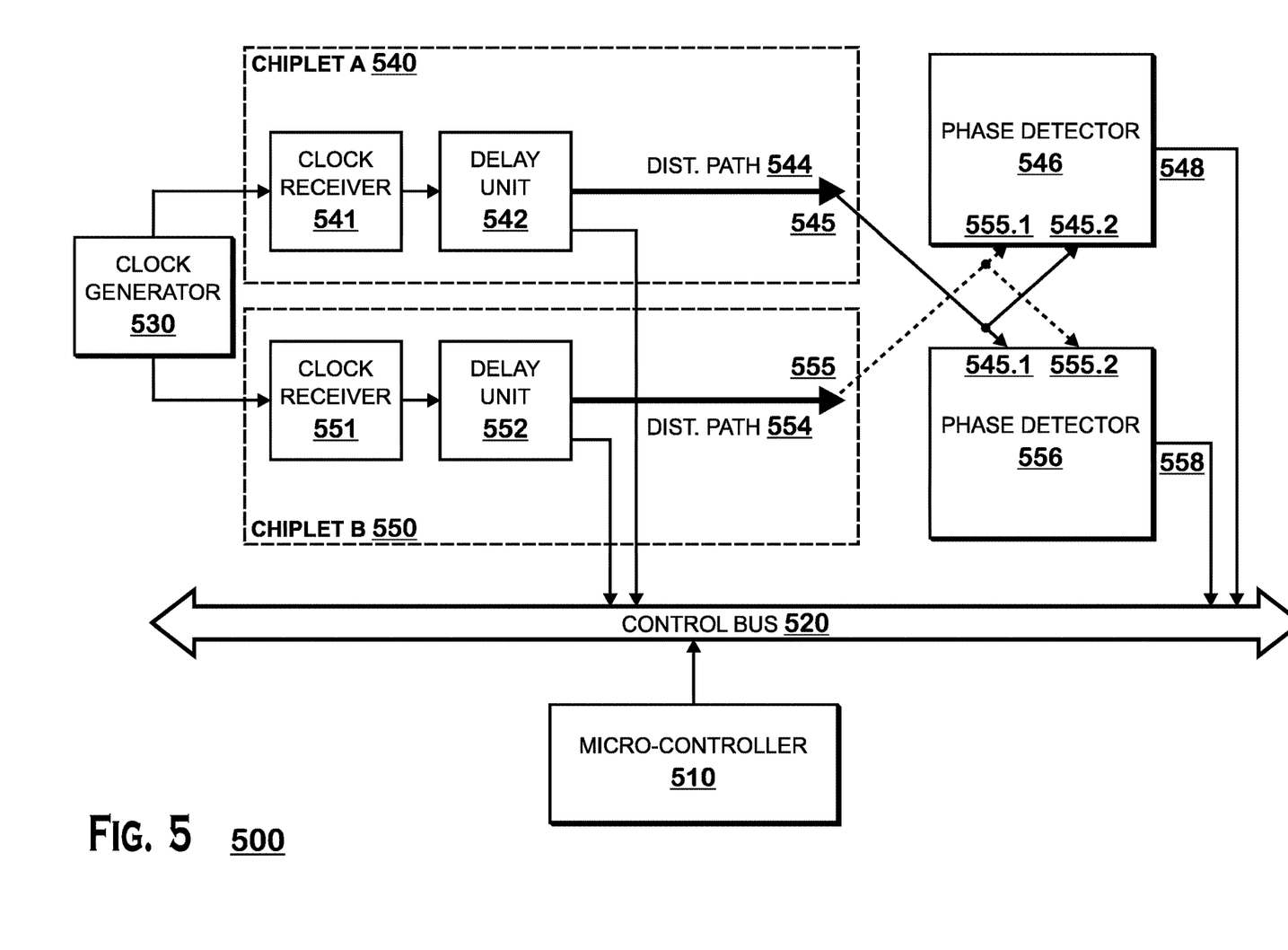
FIG. 5 is a block diagram of an example system for clock delay compensation, based on which one or more features of the disclosure can be implemented.

FIG. 5 is a block diagram of an example system 500 for clock delay compensation, based on which one or more features of the disclosure can be implemented. The system 500 demonstrates clock delay compensation with respect to two paths through which a clock signal, generated by the clock generator 530 (e.g., 410), is distributed in two neighboring chiplets, chiplet A 540 and chiplet B 550. As illustrated, associated with chiplet A 540 are a clock receiver 541 and a programmable delay unit 542 (parts of chiplet A's clock unit 480), and a clock distribution path 544 that ends at a sink point 545. Likewise, associated with chiplet B 550 are a clock receiver 551 and a programmable delay unit 552 (parts of chiplet B's clock unit 480), and a clock distribution path 554 that ends at a sink point 555. These sink points 545, 555 feed the clock signals (distributed via respective distribution path 544, 554) into respective logic units, in chiplet A and in chiplet B, that interface with each other. Accordingly, the clock signals that are measured at these sink points should be aligned. Initially, chiplet A is configured to receive 541 the clock signal, and, then, to delay 542 the clock signal by an initial delay offset (e.g., equal zero). Likewise, chiplet B is configured to receive 551 the clock signal, and, then, to delay 552 the clock signal by an initial delay offset (e.g., equal zero). As discussed, due to manufacturing variations in circuitry and wires through which the clock signal propagates, a clock signal that originates in the clock generator 530 splits into clock signals that arrive at the sink points 545, 555 of chiplet A and of chiplet B at different times. This difference in arrival times is measured by a pair of phase detectors 546, 556, as described below.

The phase detectors 546 and 556, associated with chiplet A and chiplet B, respectively, are integrated into the carrier that holds the chiplets. Each phase detector is configured to measure the phase between the clock signal of its associated chiplet and a clock signal provided from the neighboring chiplet. However, to make sure the phase measurement is accurate, the paths through which the signals travel to reach the inputs of each phase detector should be of the same length. For example, phase detector 546 is configured to measure the phase between the clock signal that arrives at sink point 545 and the clock signal that arrives at sink point 555. To secure an accurate measurement of this phase, the paths the signals travel along, from their respective sinks to the inputs of the phase detector, should be equal in length. That is, the path from sink point 545 to input 545.2 should be equal to the path from sink point 555 to input 555.1. Similarly, phase detector 556 is configured to measure the phase between the clock signal that arrives at sink point 555 and the clock signal that arrives at sink point 545. To secure an accurate measurement of this phase, the path from sink point 555 to input 555.2 should be equal in length to the path from sink point 545 to input 545.1. The resulting phase measurements, 548 and 558, of the phase detectors 546 and 556, respectively, can be accessed by the micro-controller 510 (e.g., the micro-controller 420 of FIG. 4).

Hence, the micro-controller 510, 420 is configured to monitor the phases measured by the phase detectors 450 associated with pairs of chiplets across the system 400. The micro-controller can access registers of the phase detectors that store the phase measurements via a control bus 520. Based on phase measurements received from phase detectors associated with a pair of chiplets, e.g., 546 and 556, the microcontroller can determine which of the chiplets, e.g., 540 or 550, is lagging (slower) relative to the other. The micro-controller can then adjust the delay applied by the delay unit, e.g., 542 or 552, of the faster chiplet. For example, if it was determined that the clock signal at sink point 545 of chiplet A is lagging the clock signal at sink point 555 of chiplet B, then the micro-controller 510 can update a delay offset stored in a register of the delay unit 552, via the control bus 520. In response, the delay unit 552, based on its updated delay offset, will adjust the current delay applied to the clock signal that propagates through distribution path 554—the delay unit 552 effectively slows that clock signal so that when it reaches the sink point 555 it will be aligned with the clock signal that reaches sink point 545.

Hence, through analysis of phase measurements associated with interfaces between a pair of chiplets, the microcontroller 420, can adjust the delays applied by the delay units in the clock units 480 of the pair of chiplets, as described above. For example, as a result of analysis of the phase measurements received from detectors 450.1 and 450.3 that are associated with interfaces between the pair of chiplets 430.2 and 430.3, the microcontroller 420 may update a delay offset stored in a register of the delay unit of chiplet 430.2, based on which that delay unit will delay the clock signal through the distribution tree of chiplet 430.2. Likewise, as a result of analysis of the phase measurements received from detectors 450.2 and 450.4 that are associated with interfaces between the pair of chiplets 430.3 and 430.4, the microcontroller 420 may update a delay offset stored in a register of the delay unit of chiplet 430.4, based on which update that delay unit will delay the clock signal through the distribution tree of chiplet 430.4. In this manner, the microcontroller 420 can be configured to periodically read phase measurements from the phase detectors 450 and to adjust the delays applied by the delay units in the clock units 480.

In an aspect, based on phase measurements, the microcontroller 420 can determine a global delay offset with respect to a chiplet 430 that effectuates a global propagation delay in the clock signal that is distributed throughout the chiplet. However, in addition or as an alternative to a global delay, the microcontroller 420 can determine multiple local delays with respect to a chiplet that will effectuate different local propagation delays in the clock signal that is distributed throughout the chiplet. That is, the delay unit of a chiplet, may delay clock signals that are distributed along different paths of the distribution tree according to a different delay offset. For example, the microcontroller 420, based on phase measurements it receives from phase detectors 450.1-4 associated with chiplet 430.3, may determine a global delay offset to be applied to the clock signal received by the clock unit of chiplet 430.3 and/or may determine four different local delay offsets to be applied to the clock signals that are distributed via different paths that branched out of the distribution tree. Accordingly, the receivers 541, 551 and the delay units 542, 552 of clock units 480 associated with chiplets are configured to receive the clock signal from the clock generator 410, split the received signal into multiple clock signals, and apply different delay offsets to each clock signal before propagating the differently delayed signals through respective paths of the clock distribution tree of the chiplet.

In an aspect, based on the phase measurements associated with a pair of chiplet, the microcontroller 420 may determine which one of the chiplets is faster and adjust the respective delay offset to effectively slow the propagation of the clock signal through that chiplet. Iterating through pairs of chiplets 430.2-16, the microcontroller may align the propagation of clock signals in the different chiplets by slowing the propagation of these clock signals to match the propagation of the clock signal in the slowest chiplet.

Figure 6:
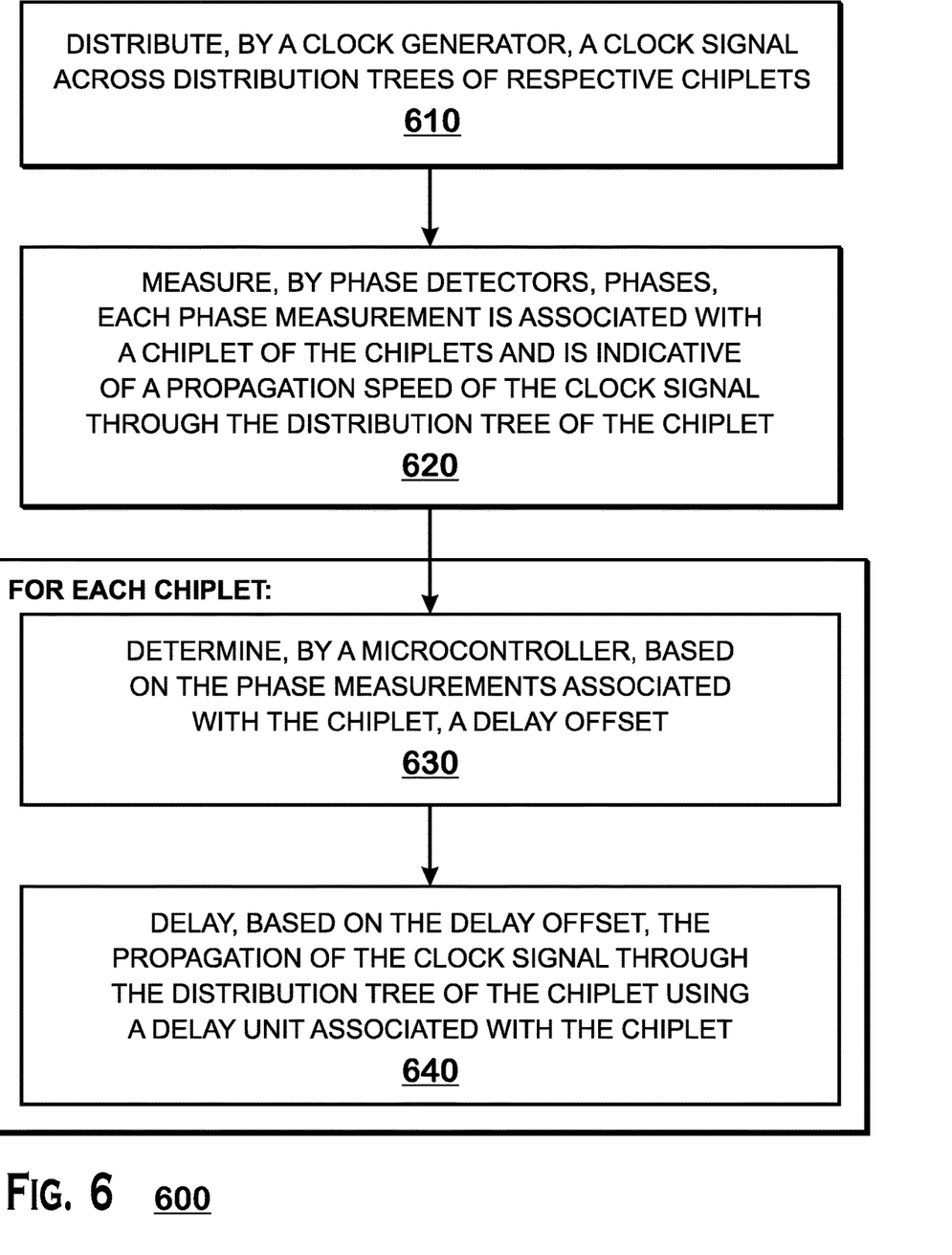
FIG. 6 is a flowchart of an example method for clock delay compensation, based on which one or more features of the disclosure can be implemented.

FIG. 6 is a flowchart of an example method 600 for clock delay compensation, based on which one or more features of the disclosure can be implemented. The method 600 adjusts delays applied to clock signals propagating through distribution trees spanning across chiplets of the system 400. In step 610 of the method 600, a clock signal is distributed, by a clock generator, across clock distribution trees of respective chiplets. In step 620, phases are measured by phase detectors. Each of the measured phases is associated with a chiplet and is indicative of a propagation speed of the clock signal across the distribution tree of that chiplet. Then, for each chiplet, the method 600 performs steps 630 and 640. In step 630, a delay offset is determined by a microcontroller based on the phase measurements associated with the chiplet. In step 640, the propagation of the clock signal across the distribution tree of the chiplet is delayed based on the delay offset. In an aspect, delaying the clock signal propagation in a chiplet can also be done by applying local delay offsets. Accordingly, for each chiplet, local delay offsets can be determined by the microcontroller based on the phase measurements associated with the chiplet. And, then, based on the determined local delay offsets, propagation of clock signals across respective paths of the distribution tree of the chiplet can be delayed using the delay unit associated with the chiplet.

The method 600 can be applied to periodically adjust for clock skews throughout the system 400. For example, phase measurements associated with pairs of chiplets can be compared. Based on the comparison, the slowest chiplet can be determined. The slowest chiplet is the one in which clock signal propagation across the chiplet's tree distribution is slower than the clock signal propagation across the distribution trees of all the other chiplets. Once the slowest chiplet among the chiplets of the system 400 is known, the delay offset of all the other chiplets can be set so that the propagation speed of all the other chiplets match the propagation speed of the slowest chiplet. Performing this process periodically allows for compensation for delays that are introduced to the system 400 as environmental conditions change (e.g., the voltage and/or temperature). In an aspect, once the slowest chiplet is determined; the further periodic compensation may be turned over to hardware state machines (or may still be performed by the microcontroller as described earlier).

It should be understood that many variations are possible based on the disclosure herein. Although features and elements are described above in particular combinations, each feature or element can be used alone without the other features and elements or in various combinations with or without other features and elements.

The methods provided can be implemented in a general-purpose computer, a processor, or a processor core. Suitable processors include, by way of example, a general-purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such as instructions capable of being stored on a computer readable media). The results of such processing can be maskworks that are then used in semiconductor manufacturing processes to manufacture processors that implement aspects of the embodiments.

The methods or flowcharts provided herein can be implemented in a computer program, software, or firmware incorporated in a non-transitory computer-readable storage medium for execution by a general-purpose computer or processor. Examples of non-transitory computer-readable media include read only memory (ROM), random-access memory (RAM), a register, cache memory, semiconductor memory devices, magnetic media such as internal hard drive and disks and removable disks, magneto-optical media, and optical media such as CD-ROM disks, and digital versatile disks (DVDs).

What is claimed is:

1. A method for clock delay compensation in a multiple chiplet system, comprising:
   distributing, by a clock generator, a clock signal across distribution trees of respective chiplets in the multiple chiplet system;
   measuring, by a phase detector, a respective phase measurement that is associated with a respective chiplet in the multiple chiplet system, wherein the respective phase measurement is indicative of a propagation speed of the clock signal through a plurality of paths of the distribution tree of the respective chiplet; and
   for each chiplet in the multiple chiplet system:
      determining, by a microcontroller, based on the respective phase measurements associated with the respective chiplet, a delay offset and local delay offsets, and
      delaying, based on the delay offset and on the local delay offsets, propagation of the clock signal through the distribution tree of the respective chiplet using a delay unit associated with the respective chiplet.

2. The method of claim 1, further comprising:
   for each chiplet in the multiple chiplet system:
      determining, by the microcontroller, based on the respective phase measurement associated with the respective chiplet, local delay offsets; and
      delaying, based on the local delay offsets, the propagation of the clock signal through respective paths in the plurality of paths of the distribution tree of the respective chiplet using the delay unit associated with the respective chiplet.

3. The method of claim 1, wherein the respective phase measurement is further indicative of a difference in arrival times of the clock signal to a first sink point, feeding a first logic unit in the respective chiplet, and to a second sink point, feeding a second logic unit in another chiplet.

4. The method of claim 3, wherein the first logic unit interfaces with the second logic unit and the clock signal controls the interface.

5. The method of claim 3, wherein a first path from the first sink point to an input of the phase detector is extended to match a length of a second path from the second sink point to another input of the phase detector.

6. The method of claim 1, further comprising:
   comparing the respective phase measurement associated with pairs of the chiplets in the multiple chiplet system; and
   determining, based on the comparing, a slowest chiplet, in which clock signal propagation through the plurality of paths of the tree distribution of a particular chiplet is slower than a clock signal propagation through the plurality of paths of the distribution trees of all other the chiplets in the multiple chiplet system.

7. The method of claim 6, wherein the determining of the delay offset for each chiplet comprises:
   setting the delay offset so that a speed of the clock signal propagation through the plurality of paths of the distribution tree of the chiplet matches a speed of the clock signal propagation through the plurality of paths of the distribution tree of the slowest chiplet.

8. A multiple chiplet system for clock delay compensation, comprising:
   at least one processor; and memory storing instructions that, when executed by the at least one processor, cause the system to:

distribute, by a clock generator, a clock signal across distribution trees of respective chiplets in the multiple chiplet system, measure, by a phase detector, a respective phase measurement that is associated with a respective chiplet in the multiple chiplet system, wherein the respective phase measurement is indicative of a propagation speed of the clock signal through a plurality of paths of the distribution tree of the respective chiplet; and for each chiplet in the multiple chiplet system:
determine, by a microcontroller, based on the respective phase measurements associated with the respective chiplet, a delay offset offset and local delay offsets, and delay, based on the delay offset and on the local delay offsets, propagation of the clock signal through the distribution tree of the respective chiplet using a delay unit associated with the respective chiplet.

9. The system of claim 8, wherein the instructions further cause the multiple chiplet system to:

for each respective chiplet in the multiple chiplet system:
determine, by the microcontroller, based on the respective phase measurement associated with the respective chiplet, local delay offsets; and delay, based on the local delay offsets, the propagation of the clock signal through respective paths in the plurality of paths of the distribution tree of the respective chiplet using the delay unit associated with the respective chiplet.

10. The system of claim 8, wherein respective phase measurement is further indicative of a difference in arrival times of the clock signal to a first sink point, feeding a first logic unit in the respective chiplet, and to a second sink point, feeding a second logic unit in another chiplet.

11. The system of claim 10, wherein the first logic unit interfaces with the second logic unit and the clock signal controls the interface.

12. The system of claim 10, wherein a first path from the first sink point to an input of the phase detector is extended to match a length of a path from the second sink point to another input of the phase detector.

13. The system of claim 8, wherein the instructions further cause the multiple chiplet system to:

compare the respective phase measurement associated with pairs of the chiplets in the multiple chiplet system; and determine, based on the comparing, a slowest chiplet, in which clock signal propagation through the plurality of paths of the tree distribution of a particular chiplet is slower than clock signal propagation through the plurality of paths of the distribution trees of all other the chiplets in the multiple chiplet system.

14. The system of claim 13, wherein the delay offset for the respective chiplet is determined by:

setting the delay offset so that a speed of the clock signal propagation through the plurality of paths of the distribution tree of the chiplet matches a speed of the clock signal propagation through the plurality of paths of the distribution tree of the slowest chiplet.

15. A non-transitory computer-readable medium comprising instructions executable by at least one processor to perform a method for clock delay compensation in a multiple chiplet system, the method comprising:

distributing, by a clock generator, a clock signal across distribution trees of respective chiplets in the multiple chiplet system;

measuring by a phase detector, a respective phase measurement that is associated with a respective chiplet in the multiple chiplet system, wherein the respective phase measurement is indicative of a propagation speed of the clock signal through a plurality of paths of the distribution tree of the respective chiplet; and for each chiplet in the multiple chiplet system:
determining, by a microcontroller, based on the respective phase measurements associated with the respective chiplet, a delay offset and local delay offsets, and delaying, based on the delay offset and on the local delay offsets, propagation of the clock signal through the distribution tree of the respective chiplet using a delay unit associated with the respective chiplet.

16. The non-transitory computer-readable medium of claim 15, wherein the method further comprises:

for each chiplet in the multiple chiplet system:
determining, by the microcontroller, based on the respective phase measurement associated with the respective chiplet, local delay offsets; and delaying, based on the local delay offsets, the propagation of the clock signal through respective paths in the plurality of paths of the distribution tree of the respective chiplet using the delay unit associated with the respective chiplet.

17. The non-transitory computer-readable medium of claim 15, wherein the respective phase measurement is further indicative of a difference in arrival times of the clock signal to a first sink point, feeding a first logic unit in the respective chiplet, and to a second sink point, feeding a second logic unit in another chiplet.

18. The non-transitory computer-readable medium of claim 17, wherein the first logic unit interfaces with the second logic unit and the clock signal controls the interface.

19. The non-transitory computer-readable medium of claim 17, wherein a first path from the first sink point to an input of the phase detector is extended to match a length of a second path from the second sink point to another input of the phase detector.

20. The non-transitory computer-readable medium of claim 15, wherein the method further comprises:

comparing the respective phase measurement associated with pairs of the chiplets in the multiple chiplet system; and determining, based on the comparing, a slowest chiplet, in which clock signal propagation through the plurality of paths of the tree distribution of a particular chiplet is slower than a clock signal propagation through the plurality of paths of the distribution trees of all other the chiplets in the multiple chiplet system.

\* \* \* \* \*